(12) United States Patent
Yang et al.

(10) Patent No.: US 11,997,681 B2
(45) Date of Patent: May 28, 2024

(54) TECHNIQUES FOR DETERMINING A CODING TABLE FOR ENCODING IN WIRELESS COMMUNICATIONS

(71) Applicant: QUALCOMM Incorporated, San Diego, CA (US)

(72) Inventors: Wei Yang, San Diego, CA (US); Yi Huang, San Diego, CA (US); Peter Gaal, San Diego, CA (US); Wanshi Chen, San Diego, CA (US); Gabi Sarkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 36 days.

(21) Appl. No.: 17/229,361

(22) Filed: Apr. 13, 2021

(65) Prior Publication Data

US 2021/0329675 A1 Oct. 21, 2021

Related U.S. Application Data

(60) Provisional application No. 63/011,798, filed on Apr. 17, 2020.

(51) Int. Cl.
*H04W 72/12* (2023.01)
*H04L 1/00* (2006.01)
*H04W 72/044* (2023.01)
*H04W 72/1268* (2023.01)
*H04W 72/21* (2023.01)
*H04W 72/50* (2023.01)

(52) U.S. Cl.
CPC ........... *H04W 72/21* (2023.01); *H04L 1/0068* (2013.01); *H04L 1/0071* (2013.01); *H04W 72/0466* (2013.01); *H04W 72/1268* (2013.01); *H04W 72/535* (2023.01)

(58) Field of Classification Search
None
See application file for complete search history.

(56) References Cited

U.S. PATENT DOCUMENTS

2011/0249578 A1* 10/2011 Nayeb Nazar ........ H04L 5/0053
370/252

FOREIGN PATENT DOCUMENTS

| CN | 104054292 A | 9/2014 | |
| GB | 2565111 * | 2/2019 | ............... H04L 1/00 |
| GB | 2565111 A | 2/2019 | |

OTHER PUBLICATIONS

Motorola, UCI Multiplexing on PUSCH in UL-MIMO, Oct. 11-15, 2010, 3GPP TSG RAN1#62bis, R1-105612, 1-11 (Year: 2010).*
Sequans Communications, Essential enhancement to rate matching of Reed Muller code, Oct. 9-13, 2017, 3GPP TSG-RAN WG1 Meeting #90bis, R1-1717727, (Year: 2017).*
International Search Report and Written Opinion—PCT/US2021/027316—ISA/EPO—dated Jun. 30, 2021.

(Continued)

Primary Examiner — Kouroush Mohebbi
(74) Attorney, Agent, or Firm — ArentFox Schiff LLP

(57) ABSTRACT

Aspects described herein relate to encoding uplink communications based on a coding table including determining to avoid certain portions of a coding table that may result decoding errors, or using a modified coding table, to improve decoding results. In one aspect, a network can transmit, to a device, a configuration indicating whether to use a modified coding table for encoding uplink communications.

30 Claims, 8 Drawing Sheets

(56) References Cited

OTHER PUBLICATIONS

Motorola: "Resource Allocation for UCT Multiplexing on PUSCH In ULMIMO", 3GPP Draft, 3GPP TSG RAN1#63,R1-106283, Resource Allocation Multiplexing (Final Clean), 3rd Generation Partnership Project (3GPP), Mobile Competence Centre, 650, Route Des Lucioles, F-06921 Sophia-Antipolis Cedex, France, vol. RAN WG1, No. Jacksonville, USA, Nov. 15, 2010, Nov. 10, 2010 (Nov. 10, 2010), XP050476144, 10 Pages, [Retrieved on Nov. 10, 2010] Section 2 "Maximum Puncturing Rates", p. 2. Section 3 "Possible definitions of Q'min", pp. 2-5.
Motorola: "UCI Multiplexing on PUSCH in UL-MIMO", 3GPP Draft, 3GPP TSG RAN1#62bis, R1-105612, R1 and HARQ ACK Transmission, 3rd Generation Partnership Project (3GPP), Mobile Competence Centre, 650, Route Des Lucioles, F-06921 Sophia-Antipolis Cedex, France, vol. RAN WG1, No. Xian, China, Oct. 14, 2010, Oct. 14, 2010 (Oct. 14, 2010), XP050489316, 11 Pages, [Retrieved on Oct. 14, 2010] Section 3 "Puncturing Limits of the RM (0, 32) Code", p. 4-p. 8, tables 1,2.
Sequans Communications: "Essential Enhancement to Rate Matching of Reed Muller Code", 3GPP Draft, 3GPP TSG-RAN WG1 Meeting #90bis, R1-1717727, RM Enhancement, 3rd Generation Partnership Project (3GPP), Mobile Competence Centre, 650, Route Des Lucioles, F-06921 Sophia-Antipolis Cedex, France, vol. RAN WG1, No. Prague, CZ, Oct. 9, 2017-Oct. 13, 2017, Oct. 8, 2017 (Oct. 8, 2017), XP051340912, 9 Pages, Retrieved from the Internet: URL: http://www.3gpp.org/ftp/Meetings_3GPP_SYNC/RAN1/Docs/. [Retrieved on Oct. 8, 2017] p. 1-p. 5.
"LTE, Evolved Universal Terrestrial Radio Access (E-UTRA), Multiplexing and Channel Coding (3GPP TS 36.212 Version 13.0.0 Release 13)", Technical Specification, European Telecommunications Standards Institute (ETSI), 650, Route Des Lucioles, F-06921 Sophia-Antipolis, France, vol. 3GPP RAN 1, No. V13.0.0, Jan. 1, 2016, XP014266405, 123 Pages, Section 5.1.4.1.2.

\* cited by examiner

TECHNIQUES FOR DETERMINING A CODING TABLE FOR ENCODING IN WIRELESS COMMUNICATIONS

CLAIM OF PRIORITY UNDER 35 U.S.C. § 119

The present Application for Patent claims priority to Provisional Patent Application No. 63/011,798, entitled "TECHNIQUES FOR DETERMINING A CODING TABLE FOR ENCODING IN WIRELESS COMMUNICATIONS" filed Apr. 17, 2020, which is assigned to the assignee hereof and hereby expressly incorporated by reference herein for all purposes.

BACKGROUND

Aspects of the present disclosure relate generally to wireless communication systems, and more particularly, to encoding wireless communications.

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which can be referred to as 5G new radio (5G NR)) is envisaged to expand and support diverse usage scenarios and applications with respect to current mobile network generations. In an aspect, 5G communications technology can include: enhanced mobile broadband addressing human-centric use cases for access to multimedia content, services and data; ultra-reliable-low latency communications (URLLC) with certain specifications for latency and reliability; and massive machine type communications, which can allow a very large number of connected devices and transmission of a relatively low volume of non-delay-sensitive information.

In some wireless communication technologies, such as 5G NR, uplink control information (UCI) is encoded using Reed-Muller (RM) codes based on a coding table. A user equipment (UE) can be configured with the coding table and can determine a submatrix of the coding table for encoding UCI by taking a number of columns representing a payload size and a number of rows representing a desired code length from the coding table.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

According to an aspect, an apparatus for wireless communication is provided that includes a transceiver, a memory configured to store instructions, and one or more processors communicatively coupled with the memory and the transceiver. The one or more processors are configured to receive, from a base station, control information scheduling uplink communications, wherein the control information indicates a payload size and a code length for encoding the uplink communications based on a code, and trigger an error case where a pair of the payload size and the code length is considered undesirable for performing the encoding.

In another aspect, an apparatus for wireless communication includes a transceiver, a memory configured to store instructions, and one or more processors communicatively coupled with the memory and the transceiver. The one or more processors are configured to receive, from a base station, a configuration indicating whether to use a modified coding table for encoding uplink communications, receive, from the base station, control information scheduling the uplink communications, wherein the control information indicates a payload size and a code length for encoding the uplink communications, encode the uplink communications based on the modified coding table based on the payload size and the code length where the configuration indicates to use the modified coding table, encode the uplink communications using an unmodified coding table based on the payload size and the code length where the configuration indicates to use the unmodified coding table, and transmit the encoded uplink communications.

In another aspects, a method for wireless communication is provided that includes receiving, from a base station, control information scheduling uplink communications, wherein the control information indicates a payload size and a code length for encoding the uplink communications based on a code, and triggering an error case where a pair of the payload size and the code length is considered undesirable for performing the encoding.

In another aspect, a method for wireless communication is provided that includes receiving, from a base station, a configuration indicating whether to use a modified coding table for encoding uplink communications, receiving, from the base station, control information scheduling the uplink communications, wherein the control information indicates a payload size and a code length for encoding the uplink communications, encoding the uplink communications based on the modified coding table based on the payload size and the code length where the configuration indicates to use the modified coding table, encoding the uplink communications using an unmodified coding table based on the payload size and the code length where the configuration indicates to use the unmodified coding table, and transmitting the encoded uplink communications In a further aspect, an apparatus for wireless communication is provided that includes a transceiver, a memory configured to store instructions, and one or more processors communicatively coupled with the transceiver and the memory. The one or more processors are configured to execute the instructions to perform the operations of methods described herein. In another aspect, an apparatus for wireless communication is provided that includes means for performing the operations of methods described herein. In yet another aspect, a computer-readable medium is provided including code executable by one or more processors to perform the operations of methods described herein.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
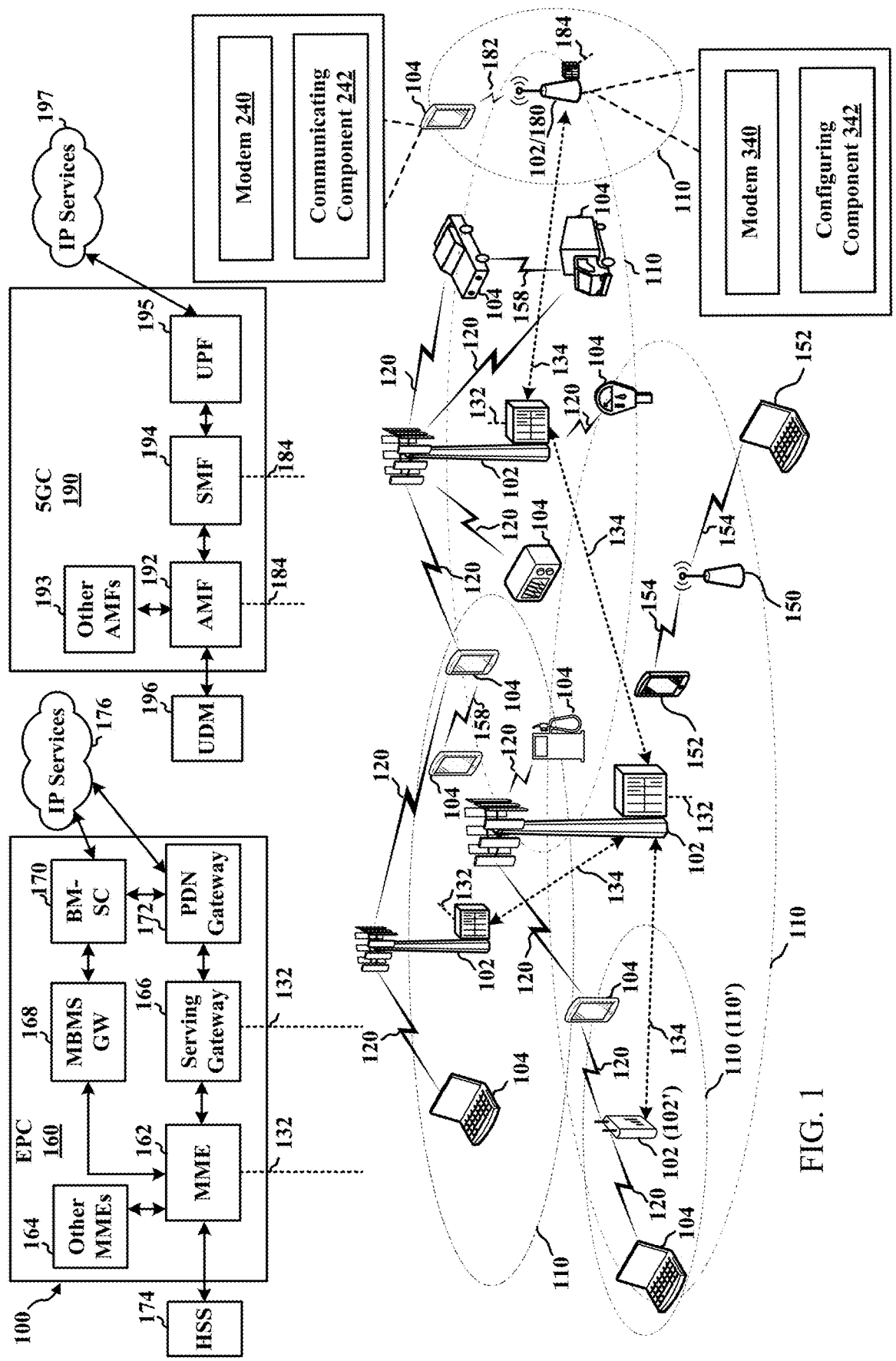
FIG. 1 illustrates an example of a wireless communication system, in accordance with various aspects of the present disclosure.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

The described features generally relate to encoding communications based on an encoding table. In an example, in fifth generation (5G) new radio (NR), a coding table used by a user equipment (UE), base station, or other device for encoding communications may have a number of rows representing a payload size to be encoded and a number of columns representing a desired code length. A device can select a submatrix of the coding table for encoding communications based on the payload size and desired code length pair. Some coding tables, such as the Reed-Muller (RM) coding table specified for use in encoding uplink control information (UCI) in 5G NR, can have columns with some repeated consecutive values. Accordingly, for example, some pairs of payload size (also referred to herein as K) and desired code length (also referred to herein as N) may not produce desired coding results. For example, where the coding table for some K×N submatrices can have columns with repeated consecutive values that are similar across multiple columns, this may result in a device that receives the encoded information not being able to differentiate some of the encoded bits. This may lead to unsuccessful decoding of the information. In another example, some pairs of payload size (also referred to herein as K) and desired code length may result in a coding table that has all zeros for a certain bit, which may also lead to unsuccessful decoding of the information.

In aspects described herein, for UCI to be encoded, a base station can avoid scheduling a user equipment (UE) with undesirable (K, N) pairs and/or the UE can consider receiving scheduling with undesirable (K, N) pairs as an error case. In other aspects described herein, the UE can use a modified coding table having different values for the (K, N) pairs from the original unmodified coding table that are considered undesirable for encoding uplink communications at the UE. In one aspect, the modified coding table can be stored in the UE, configured by the base station, and/or the like, and/or the base station can configure the UE to use the modified coding table instead of the unmodified coding table. In another aspect, the UE can generate the modified coding table based permuting rows of the unmodified coding table to avoid the existence of the undesirable pairs. In another aspect, the UE can encode the uplink communications based on the modified coding table by interleaving an encoding before performing rate matching, where the encoding can be generated based on the unmodified coding table. In any case, the base station can also configured the UE with an indication to perform the permuting/interleaving, parameters or other instructions for performing the permuting/interleaving, and/or the like.

The aspects described herein provide an advantage for encoding wireless communications for substantially any payload size and code length without a receiving device experiencing errors in receiving the communications that may result from inability to distinguish information bits. This can improve throughput of the wireless communications at least for the certain pairs of payload size and desired code length.

The described features will be presented in more detail below with reference to FIGS. 1-8.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets, such as data from one component interacting with another component in a local system, distributed system, and/or across a network such as the Internet with other systems by way of the signal.

Techniques described herein may be used for various wireless communication systems such as CDMA, TDMA, FDMA, OFDMA, SC-FDMA, and other systems. The terms "system" and "network" may often be used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A system for purposes of example, and LTE terminology is used in much of the description below, although the techniques are applicable beyond LTE/LTE-A applications (e.g., to fifth generation (5G) new radio (NR) networks or other next generation communication systems).

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Various aspects or features will be presented in terms of systems that can include a number of devices, components, modules, and the like. It is to be understood and appreciated that the various systems can include additional devices, components, modules, etc. and/or may not include all of the devices, components, modules etc. discussed in connection with the figures. A combination of these approaches can also be used.

FIG. 1 is a diagram illustrating an example of a wireless communications system and an access network 100. The wireless communications system (also referred to as a wireless wide area network (WWAN)) can include base stations 102, UEs 104, an Evolved Packet Core (EPC) 160, and/or a 5G Core (5GC) 190. The base stations 102 may include macro cells (high power cellular base station) and/or small cells (low power cellular base station). The macro cells can include base stations. The small cells can include femtocells, picocells, and microcells. In an example, the base stations 102 may also include gNBs 180, as described further herein. In one example, some nodes of the wireless communication system may have a modem 240 and communicating component 242 for encoding uplink communications based on determining a coding table and/or based on pairs of payload size and code length, in accordance with aspects described herein. In addition, some nodes may have a modem 340 and configuring component 342 for configuring a device for encoding uplink communications, in accordance with aspects described herein. Though a UE 104 is shown as having the modem 240 and communicating component 242 and a base station 102/gNB 180 is shown as having the modem 340 and configuring component 342, this is one illustrative example, and substantially any node or type of node may include a modem 240 and communicating component 242 and/or a modem 340 and configuring component 342 for providing corresponding functionalities described herein.

The base stations 102 configured for 4G LTE (which can collectively be referred to as Evolved Universal Mobile Telecommunications System (UMTS) Terrestrial Radio Access Network (E-UTRAN)) may interface with the EPC 160 through backhaul links 132 (e.g., using an S1 interface). The base stations 102 configured for 5G NR (which can collectively be referred to as Next Generation RAN (NG-RAN)) may interface with 5GC 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or 5GC 190) with each other over backhaul links 134 (e.g., using an X2 interface). The backhaul links 134 may be wired or wireless.

The base stations 102 may wirelessly communicate with one or more UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be referred to as a heterogeneous network. A heterogeneous network may also include Home Evolved Node Bs (eNBs) (HeNBs), which may provide service to a restricted group, which can be referred to as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (e.g., for x component carriers) used for transmission in the DL and/or the UL direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

In another example, certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include an eNB, gNodeB (gNB), or other type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 182 with the UE 104 to compensate for the extremely high path loss and short range. A base station 102 referred to herein can include a gNB 180.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 can be a control node that processes the signaling between the UEs 104 and the 5GC 190. Generally, the AMF 192 can provide QoS flow and session management. User Internet protocol (IP) packets (e.g., from one or more UEs 104) can be transferred through the UPF 195. The UPF 195 can provide UE IP address allocation for one or more UEs, as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or 5GC 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). IoT UEs may include machine type communication (MTC)/enhanced MTC (eMTC, also referred to as category (CAT)-M, Cat M1) UEs, NB-IoT (also referred to as CAT NB1) UEs, as well as other types of UEs. In the present disclosure, eMTC and NB-IoT may refer to future technologies that may evolve from or may be based on these technologies. For example, eMTC may include FeMTC (further eMTC), eFeMTC (enhanced further eMTC), mMTC (massive MTC), etc., and NB-IoT may include eNB-IoT (enhanced NB-IoT), FeNB-IoT (further enhanced NB-IoT), etc. The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

In an example, configuring component 342 can configure a UE 104 with resources for transmitting uplink communications, such as UCI, where the configuration of resources can include or otherwise be associated with an indication of a payload size and code length for encoding the uplink communications. In one example, communicating component 242 can receive the indication of the resources and/or receive or determine a corresponding payload size and code length, and then communicating component 242 can determine, based on the payload size and code length pair, whether to encode the uplink communications. In another example, communicating component 242 can determine whether to use a modified coding table to encode the uplink communications, which may be based on an indication and/or instructions or parameters received from the base station 102 via configuring component 342.

Figure 3:
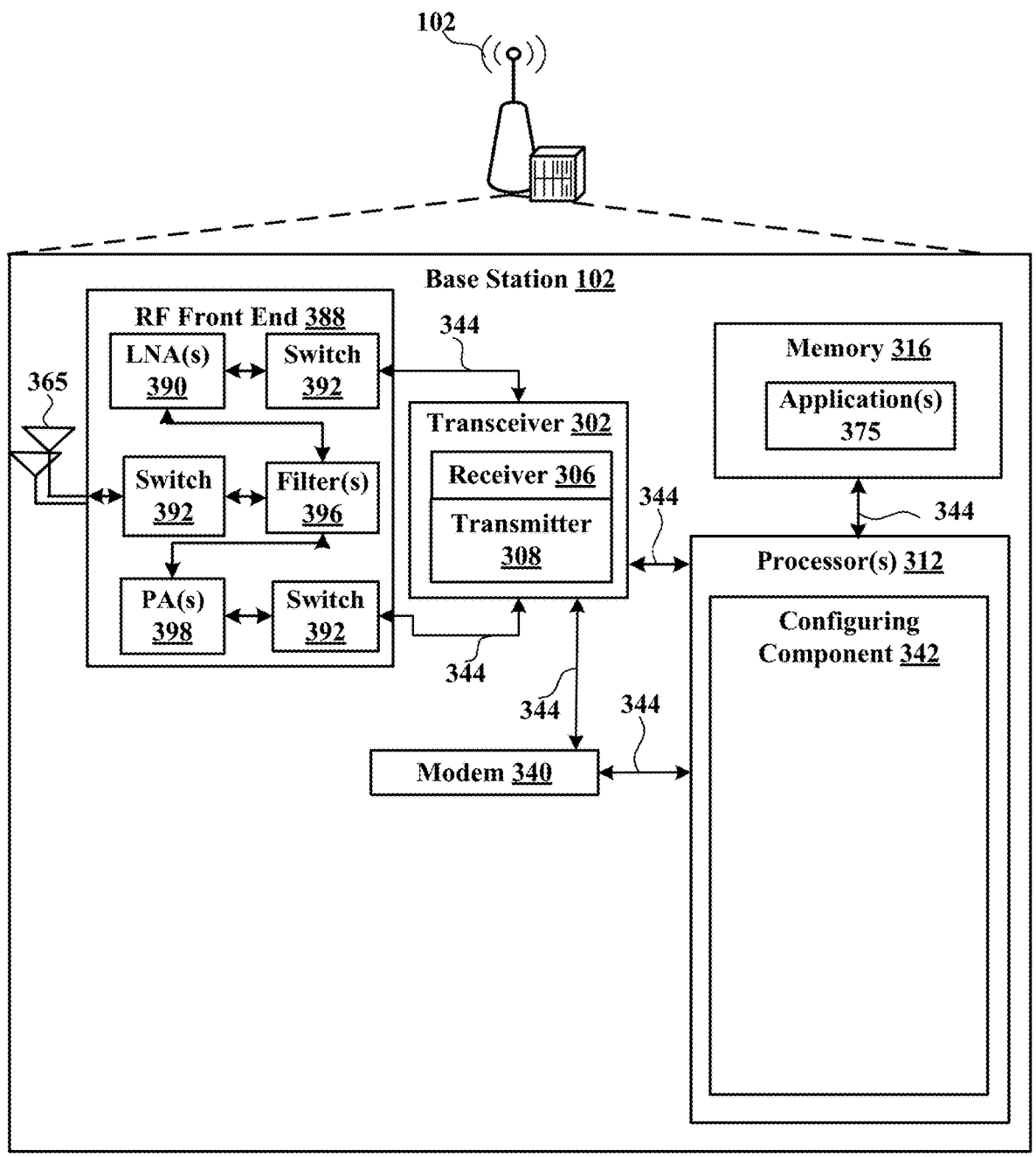
FIG. 3 is a block diagram illustrating an example of a base station, in accordance with various aspects of the present disclosure.
Figure 4:
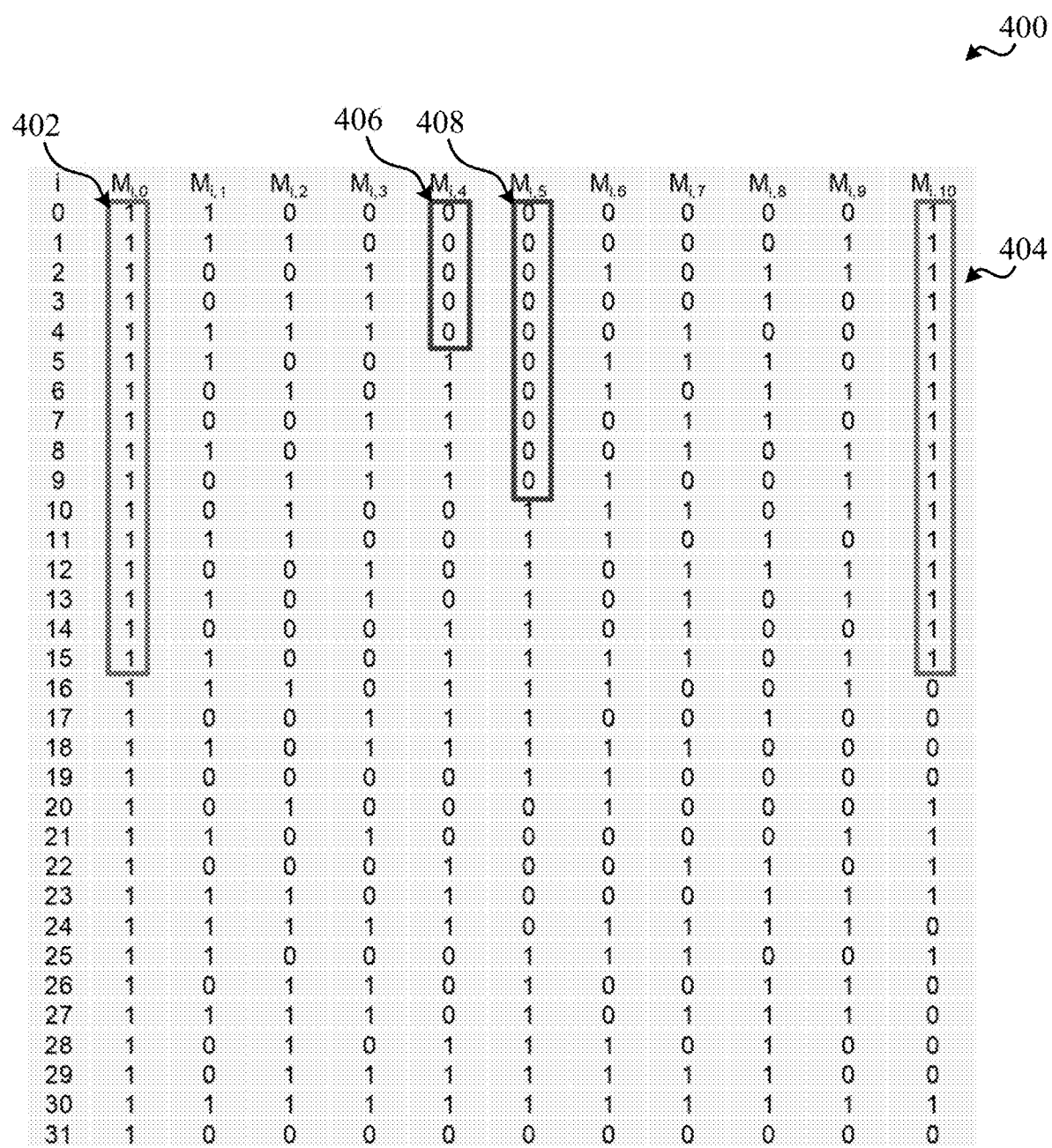
FIG. 4 illustrates an example of a Reed-Muller coding table defined for use in certain radio access technologies, in accordance with various aspects of the present disclosure.
Figure 5:
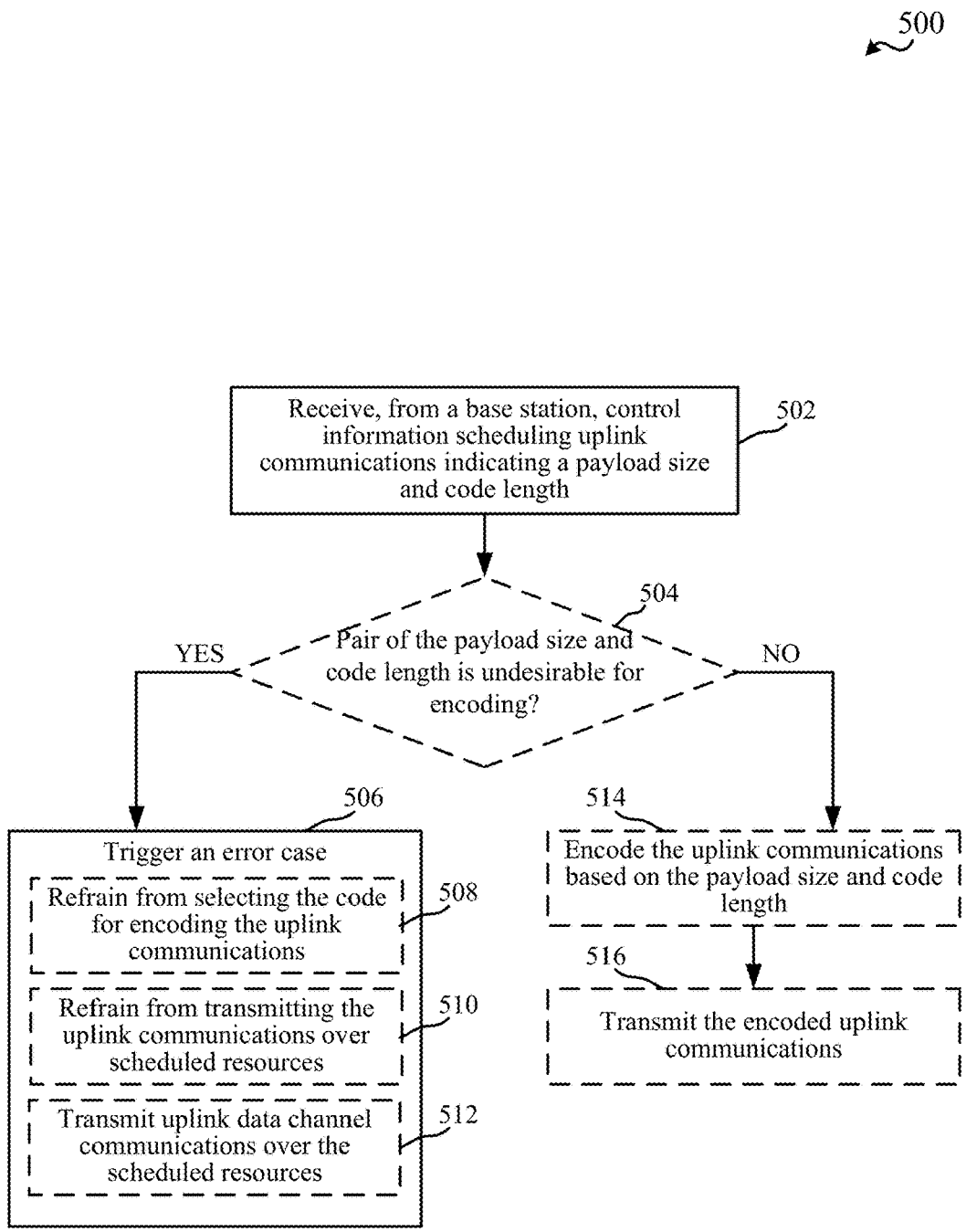
FIG. 5 is a flow chart illustrating an example of a method for encoding uplink communications by avoiding certain payload size and code length pairs, in accordance with various aspects of the present disclosure.
Figure 6:
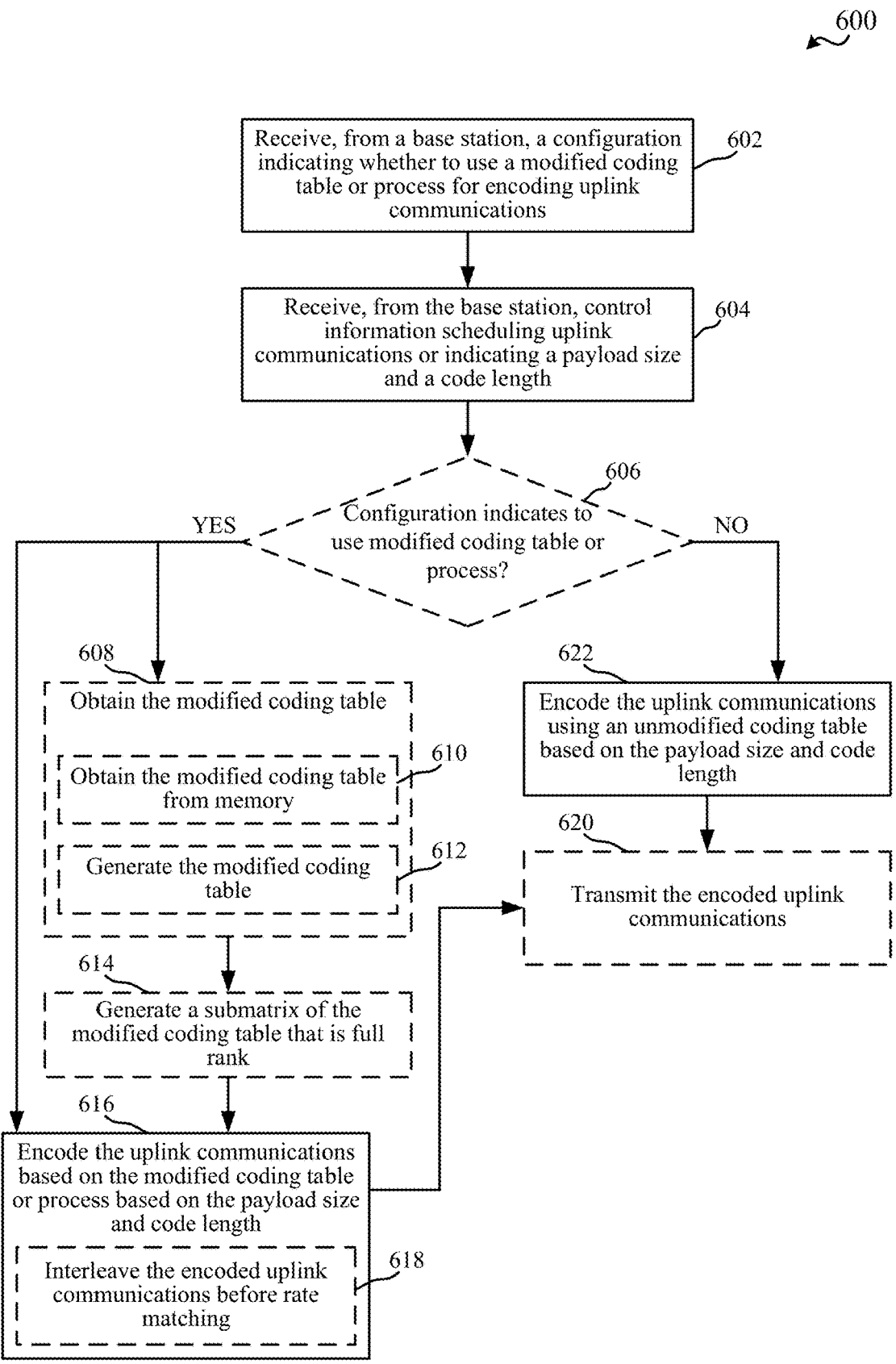
FIG. 6 is a flow chart illustrating an example of a method for encoding uplink communications using a modified coding table, in accordance with various aspects of the present disclosure.
Figure 7:
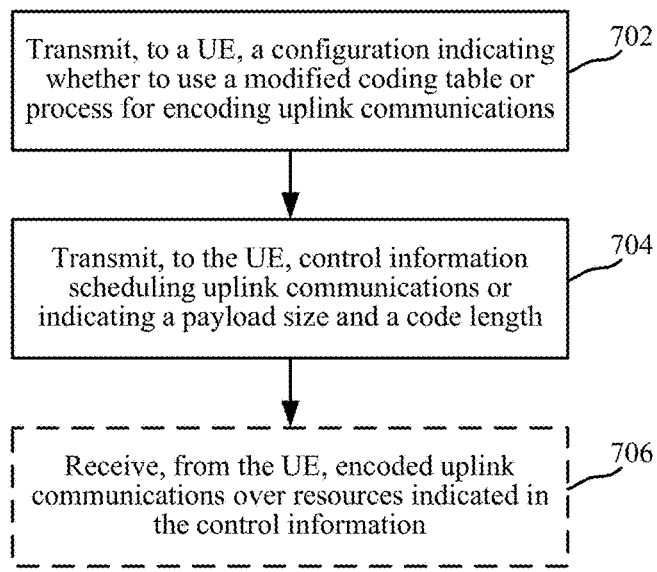
FIG. 7 is a flow chart illustrating an example of a method for configuring a user equipment for encoding uplink communications using a modified coding table, in accordance with various aspects of the present disclosure.

Turning now to FIGS. 2-8, aspects are depicted with reference to one or more components and one or more methods that may perform the actions or operations described herein, where aspects in dashed line may be optional. Although the operations described below in FIGS. 5-7 are presented in a particular order and/or as being performed by an example component, it should be understood that the ordering of the actions and the components performing the actions may be varied, depending on the implementation. Moreover, it should be understood that the following actions, functions, and/or described components may be performed by a specially programmed processor, a processor executing specially programmed software or computer-readable media, or by any other combination of a hardware component and/or a software component capable of performing the described actions or functions.

Figure 2:
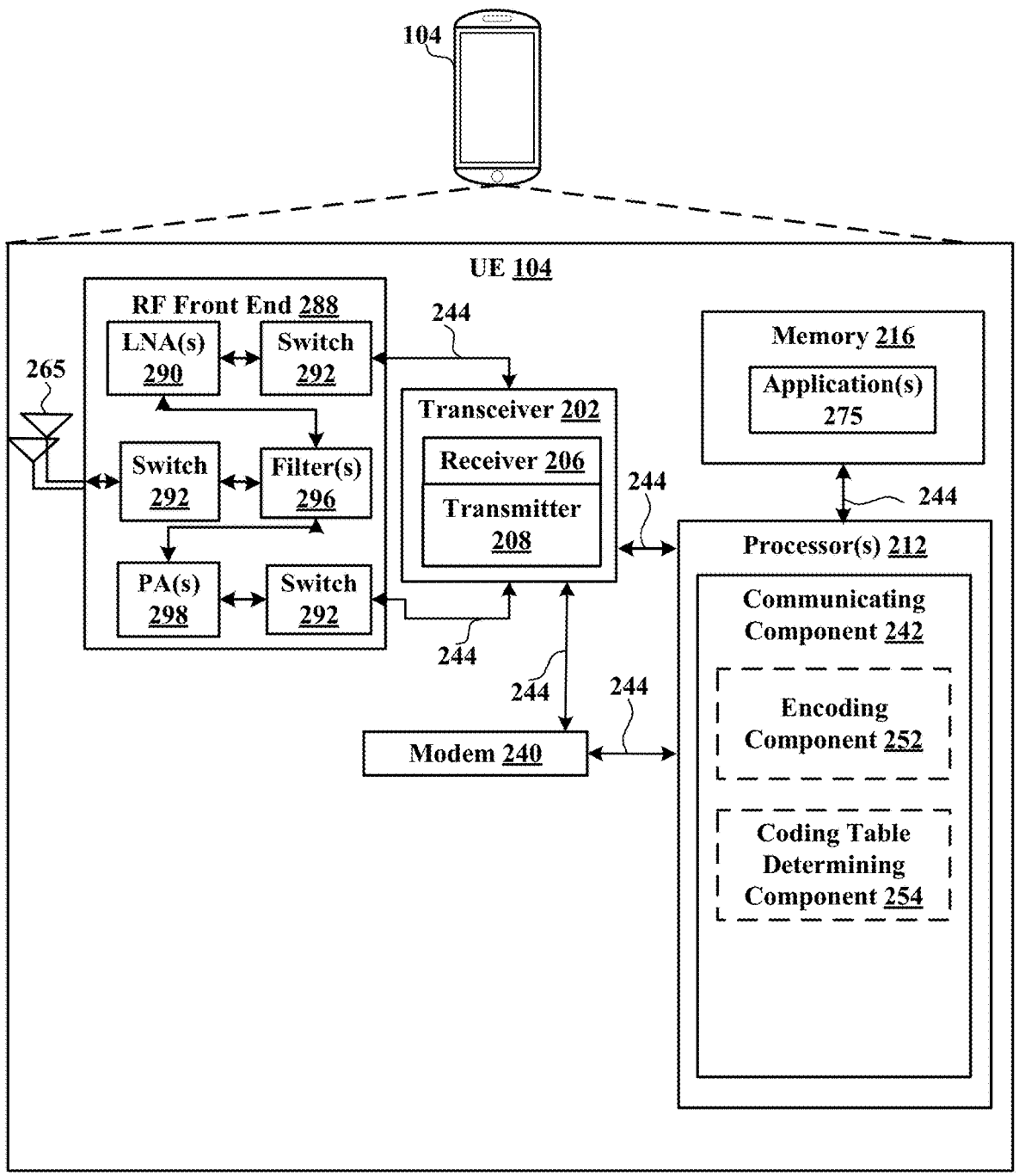
FIG. 2 is a block diagram illustrating an example of a UE, in accordance with various aspects of the present disclosure.

Referring to FIG. 2, one example of an implementation of UE 104 may include a variety of components, some of which have already been described above and are described further herein, including components such as one or more processors 212 and memory 216 and transceiver 202 in communication via one or more buses 244, which may operate in conjunction with modem 240 and/or communicating component 242 for encoding uplink communications based on determining a coding table and/or based on pairs of payload size and code length, in accordance with aspects described herein.

In an aspect, the one or more processors 212 can include a modem 240 and/or can be part of the modem 240 that uses one or more modem processors. Thus, the various functions related to communicating component 242 may be included in modem 240 and/or processors 212 and, in an aspect, can be executed by a single processor, while in other aspects, different ones of the functions may be executed by a combination of two or more different processors. For example, in an aspect, the one or more processors 212 may include any one or any combination of a modem processor, or a baseband processor, or a digital signal processor, or a transmit processor, or a receiver processor, or a transceiver processor associated with transceiver 202. In other aspects, some of the features of the one or more processors 212 and/or modem 240 associated with communicating component 242 may be performed by transceiver 202.

Also, memory 216 may be configured to store data used herein and/or local versions of applications 275 or communicating component 242 and/or one or more of its subcomponents being executed by at least one processor 212. Memory 216 can include any type of computer-readable medium usable by a computer or at least one processor 212, such as random access memory (RAM), read only memory (ROM), tapes, magnetic discs, optical discs, volatile memory, non-volatile memory, and any combination thereof. In an aspect, for example, memory 216 may be a non-transitory computer-readable storage medium that stores one or more computer-executable codes defining communicating component 242 and/or one or more of its subcomponents, and/or data associated therewith, when UE 104 is operating at least one processor 212 to execute communicating component 242 and/or one or more of its subcomponents.

Transceiver 202 may include at least one receiver 206 and at least one transmitter 208. Receiver 206 may include hardware, firmware, and/or software code executable by a processor for receiving data, the code comprising instructions and being stored in a memory (e.g., computer-readable medium). Receiver 206 may be, for example, a radio frequency (RF) receiver. In an aspect, receiver 206 may receive signals transmitted by at least one base station 102. Additionally, receiver 206 may process such received signals, and also may obtain measurements of the signals, such as, but not limited to, Ec/Io, signal-to-noise ratio (SNR), reference signal received power (RSRP), received signal strength indicator (RSSI), etc. Transmitter 208 may include hardware, firmware, and/or software code executable by a processor for transmitting data, the code comprising instructions and being stored in a memory (e.g., computer-readable medium). A suitable example of transmitter 208 may including, but is not limited to, an RF transmitter.

Moreover, in an aspect, UE 104 may include RF front end 288, which may operate in communication with one or more antennas 265 and transceiver 202 for receiving and transmitting radio transmissions, for example, wireless communications transmitted by at least one base station 102 or wireless transmissions transmitted by UE 104. RF front end 288 may be connected to one or more antennas 265 and can include one or more low-noise amplifiers (LNAs) 290, one or more switches 292, one or more power amplifiers (PAs) 298, and one or more filters 296 for transmitting and receiving RF signals.

In an aspect, LNA 290 can amplify a received signal at a desired output level. In an aspect, each LNA 290 may have a specified minimum and maximum gain values. In an aspect, RF front end 288 may use one or more switches 292 to select a particular LNA 290 and its specified gain value based on a desired gain value for a particular application.

Further, for example, one or more PA(s) 298 may be used by RF front end 288 to amplify a signal for an RF output at a desired output power level. In an aspect, each PA 298 may have specified minimum and maximum gain values. In an aspect, RF front end 288 may use one or more switches 292 to select a particular PA 298 and its specified gain value based on a desired gain value for a particular application.

Also, for example, one or more filters 296 can be used by RF front end 288 to filter a received signal to obtain an input RF signal. Similarly, in an aspect, for example, a respective filter 296 can be used to filter an output from a respective PA 298 to produce an output signal for transmission. In an aspect, each filter 296 can be connected to a specific LNA 290 and/or PA 298. In an aspect, RF front end 288 can use one or more switches 292 to select a transmit or receive path using a specified filter 296, LNA 290, and/or PA 298, based on a configuration as specified by transceiver 202 and/or processor 212.

As such, transceiver 202 may be configured to transmit and receive wireless signals through one or more antennas 265 via RF front end 288. In an aspect, transceiver may be tuned to operate at specified frequencies such that UE 104 can communicate with, for example, one or more base stations 102 or one or more cells associated with one or more base stations 102. In an aspect, for example, modem 240 can configure transceiver 202 to operate at a specified frequency and power level based on the UE configuration of the UE 104 and the communication protocol used by modem 240.

In an aspect, modem 240 can be a multiband-multimode modem, which can process digital data and communicate with transceiver 202 such that the digital data is sent and received using transceiver 202. In an aspect, modem 240 can be multiband and be configured to support multiple frequency bands for a specific communications protocol. In an aspect, modem 240 can be multimode and be configured to support multiple operating networks and communications protocols. In an aspect, modem 240 can control one or more components of UE 104 (e.g., RF front end 288, transceiver 202) to enable transmission and/or reception of signals from the network based on a specified modem configuration. In an aspect, the modem configuration can be based on the mode of the modem and the frequency band in use. In another aspect, the modem configuration can be based on UE configuration information associated with UE 104 as provided by the network during cell selection and/or cell reselection.

In an aspect, communicating component 242 can optionally include an encoding component 252 for encoding uplink communications and/or a coding table determining component 254 for determining or generating a coding table for encoding uplink communications, in accordance with aspects described herein.

In an aspect, the processor(s) 212 may correspond to one or more of the processors described in connection with the UE in FIG. 8. Similarly, the memory 216 may correspond to the memory described in connection with the UE in FIG. 8.

Referring to FIG. 3, one example of an implementation of base station 102 (e.g., a base station 102 and/or gNB 180, as described above) may include a variety of components, some of which have already been described above, but including components such as one or more processors 312 and memory 316 and transceiver 302 in communication via one or more buses 344, which may operate in conjunction with modem 340 and configuring component 342 for configuring a device for encoding uplink communications, in accordance with aspects described herein.

The transceiver 302, receiver 306, transmitter 308, one or more processors 312, memory 316, applications 375, buses 344, RF front end 388, LNAs 390, switches 392, filters 396, PAs 398, and one or more antennas 365 may be the same as or similar to the corresponding components of UE 104, as described above, but configured or otherwise programmed for base station operations as opposed to UE operations.

In an aspect, the processor(s) 312 may correspond to one or more of the processors described in connection with the base station in FIG. 8. Similarly, the memory 316 may correspond to the memory described in connection with the base station in FIG. 8.

FIG. 4 illustrates an example of a RM coding table 400 configured in LTE and 5G NR. In an example, an (11,32) code can be used, which encodes 11 bits payload into 32 bits coded bits, and rate matching can be used to reduce/extend the 32 bits to an arbitrary length. This RM code, however, may have some issues at high coding rate—namely for certain payload size K and rate-matching length N combinations, where K<=N, the code may not be decoded correctly even at very high signal-to-noise (SNR) ratio. In 5G NR, a UE can encode a UCI code block $\{c_k\}$ by:

$$d_i = \Sigma_{k=0}^{K} c_k M_{i,k} \bmod 2, i=0,\ldots,31$$

where K is a payload size and $\{M_{i,k}\}$ is a submatrix given in the example RM encoding table 400. After encoding, the UE can rate-match the code to a desired code length N. As described above and further herein, K and N can be indicated by the base station in scheduling resources for transmitting the UCI. If N<=32, for example, the UE can select the first N elements from the 32 encoded bits, which can correspond to using the first N rows from the RM coding table 400 to encode the UCI. If N>32, for example, the UE can cyclically extend the code to length N.

The RM coding table 400, however, has some identical columns (or column vectors) for some selected submatrices. For example, for K=11 and N=16, the 16 rows of the first column 402 and the first 16 rows of the last column 404 have the same values, which may result in the receiving device being unable to correctly distinguish the first information bit from the last information bit where the 11×16 submatrix (or K=11 for substantially any N=1 to 16) is used to encode the UCI. Similarly, for example, the sixth column 408 has 10 0's, which can imply that for 6<=K<=10 and K<=N<=10, the sixth bit cannot be decoded correctly. Other problematic (K, N) pairs based on RM table 400 can include (4,4), (5,5), (6,6), (6,7), (6,8), (6,9), (6,10), (7,7), (7,8), (7,9), (7,10), (8,8), (8,9), (8,10), (9,9), (9,10), (10,10), (11,11), (11,12), (11,13), (11,14), (11,15), (11,16). In an example, in LTE, the base station may not schedule the problematic (K, N) pairs over an uplink control channel (e.g., physical uplink control channel (PUCCH)), and this may be only an issue when UCI is transmitted on an uplink data channel (e.g., physical uplink shared channel (PUSCH)). In an example, in 5G NR, the issue may arise for substantially any UCI transmission.

FIG. 5 illustrates a flow chart of an example of a method 500 for encoding uplink communications based on determining whether a pair of payload size and code length is desirable, in accordance with aspects described herein. In an example, a UE can perform the functions described in method 500 using one or more of the components described in FIGS. 1 and 2.

In method 500, at Block 502, control information scheduling uplink communications indicating a payload size and code length can be received from a base station. In an aspect, communicating component 242, e.g., in conjunction with processor(s) 212, memory 216, transceiver 202, etc., can receive, from the base station, control information scheduling uplink communications indicating the payload size and the code length. For example, the control information can be received from the base station in a resource grant from the base station, which may include downlink control information (DCI). In an example, DCI can be received over a downlink control channel (e.g., physical downlink control channel (PDCCH)) or downlink data channel (e.g., physical downlink shared channel (PDSCH)), etc. For example, the control information may relate to, or may specify, time and/or frequency resources over which the UE 104 is to transmit UCI or other uplink communications. For example, the time and/or frequency resources may include a portion of frequency, such as one or more subcarriers, over a portion of time, such as one or more symbols (e.g., orthogonal frequency division multiplexing (OFDM) symbols, single carrier frequency division multiplexing (SC-FDM) symbols, etc.), which may include another resource unit defined in the wireless communication technology, such as one or more resource blocks (RBs) defined in 5G NR). In addition, the resource grant or another signal from the base station can indicate a payload size and code length to use in encoding the uplink communications. In an example, the uplink communications can include UCI for transmitting to the base station. Moreover, as described, the payload size and code length can be used for determining a submatrix of the coding table (e.g., RM coding table 400) to use to encode the uplink communications.

In method 500, optionally at Block 504, it can be determined whether a pair of the payload size and code length is undesirable for encoding. In an aspect, encoding component 252, e.g., in conjunction with processor(s) 212, memory 216, transceiver 202, communicating component 242, etc., can determine whether the pair of the payload size and the code length is undesirable for encoding. For example, encoding component 252 can be configured with information that can indicate, or allow determination of, a list of undesirable pairs of payload size and code length in the configured RM coding table 400 that are undesirable for encoding (e.g., based on the list of pairs mentioned above and/or other pairs that result in undesirable encodings for one reason or another). For example, the list can be stored in memory 216 of the UE 104. In this regard, for example, the submatrices of the RM coding table 400 indicated by the number of columns K and the number of rows N from the undesirable pairs can be considered rank deficient. These undesirable pairs may be avoided for the purposes of encoding the uplink communications. In one example, the base station 102 may have a scheduling restriction to avoid scheduling UCI transmission that results in the undesirable pairs. For example, for a given payload size K the base station can avoid scheduling a code length N that results in one of the undesirable pairs.

In method 500, where the pair is undesirable for encoding at Block 504, at Block 506, an error case can be triggered. In an aspect, encoding component 252, e.g., in conjunction with processor(s) 212, memory 216, transceiver 202, communicating component 242, etc., can trigger the error case where the pair is undesirable for encoding. For example, this may be based on encoding component 252 determining that the pair of payload size and code length is in the list of pairs that are undesirable for decoding. In triggering an error case in this regard, for example, encoding component 252 can avoid encoding the uplink communications based on the undesirable pair to prevent decoding error at the receiver (e.g., at the base station 102), as described above.

In one example, in triggering the error case at Block 506, optionally at Block 508, selecting the code for encoding the uplink communications can be refrained from. In an aspect, encoding component 252, e.g., in conjunction with processor(s) 212, memory 216, transceiver 202, communicating component 242, etc., can refrain from selecting the code for encoding the uplink communications. For example, encoding component 252 can avoid using (or not use) the code for encoding the uplink communications or can refrain from encoding the uplink communications altogether.

Similarly, for example, in triggering the error case at Block 506, optionally at Block 510, transmitting the uplink communications over scheduled resources can be refrained from. In an aspect, communicating component 242, e.g., in conjunction with processor(s) 212, memory 216, transceiver 202, etc., can refrain from transmitting the uplink communications over scheduled resources. In this example, the base station 102 may still schedule UCI for transmission using the undesirable pairs, but the UE 104 may not transmit the UCI if the it results in undesirable (K,N) pairs (e.g., so the base station 102 does not attempt to decode communications encoded using undesirable (K,N) pairs).

In an example, this can apply both to UCI on PUSCH and UCI on PUCCH. In this example, for UCI on PUSCH however, the UE 104 can drop the UCI and transmit the PUSCH if the PUSCH contains uplink shared channel (UL-SCH) (e.g., uplink data). Thus, for example, in triggering the error case at Block 506, optionally at Block 512, uplink data channel communications can still be transmitted over the scheduled resources, even though the UCI may not be transmitted. In an aspect, communicating component 242, e.g., in conjunction with processor(s) 212, memory 216, transceiver 202, etc., can transmit the uplink data channel communications over the scheduled resources (e.g., without transmitting the uplink communications that correspond to UCI).

In method 500, where it is determined that the pair is not undesirable for encoding at Block 504, optionally at Block 514, the uplink communications can be encoded based on the payload size and code length. In an aspect, encoding component 252, e.g., in conjunction with processor(s) 212, memory 216, transceiver 202, communicating component 242, etc., can encode the uplink communications based on the payload size and the code length. As described, for example, encoding component 252 can encode the uplink communications based on the RM coding table 400 using payload size K columns and 32 rows and/or according to the formula described above, and then can rate match the encoding by selecting a number N rows where N<32 (or cyclically extending where N>32).

In method 500, optionally at Block 516, the encoded uplink communications can be transmitted. In an aspect, encoding component 252, e.g., in conjunction with processor(s) 212, memory 216, transceiver 202, communicating component 242, etc., can transmit the encoded uplink communications over the scheduled resources. This can include transmitting the encoded uplink communications over time and/or frequency resources scheduled by the base station 102, as described, such as over one or more RBs.

FIG. 6 illustrates a flow chart of an example of a method 600 for encoding uplink communications based on determining a coding table to use, in accordance with aspects described herein. In an example, a UE can perform the functions described in method 600 using one or more of the components described in FIGS. 1 and 2.

In method 600, at Block 602, a configuration indicating whether to use a modified coding table or process for encoding uplink communications can be received from a base station. In an aspect, communicating component 242, e.g., in conjunction with processor(s) 212, memory 216, transceiver 202, etc., can receive, from the base station, the configuration indicating whether to use a modified coding table or process for encoding uplink communications. In an example, the UE 104 can store (e.g., in memory 216) the RM coding table 400 and a modified RM coding table that has different values for at least some of the columns that result in the undesirable pairs. For example, in the modified (e.g., new) table, at least one of the first column, fifth column, sixth column, or eleventh column can be changed with another binary sequence that avoids the long string of zeros or ones in the beginning of the column, as shown of the RM coding table 400 in FIG. 4 at 402, 404, 406, 408.

In one example, the configuration can indicate the coding table to be used or can be an indication to use one of multiple stored coding tables (e.g., an indicator to use the modified coding table or not, where not using the modified coding table can implicitly indicate to use the original unmodified coding table, which can be the RM coding table 400). For example, the configuration can include a radio resource control (RRC) signaling (e.g., from base station 102 to the UE 104) to indicate to the UE 104 whether the new RM coding table or the old RM coding table should be used for encoding a UCI transmission.

In another example, the configuration can indicate whether to modify a stored coding table to generate a modified coding table. For example, the configuration can indicate whether to permute rows of the coding table, or rows of a submatrix generated from the coding table, to avoid the long strings of zeros or ones. In an example, the configuration may indicate whether to permute rows of the RM coding table 400. In this example, the configuration may include a RRC signaling to let the base station 102 indicate to the UE 104 to permute the rows of the coding table, and/or one or more parameters for permuting the rows (e.g., an index or indices indicating which row(s) to permute), etc. In another example, the configuration may indicate whether to apply an interleaving function to an encoded bit string after RM encoding and before rate matching in encoding the bit stream. For example, the interleaving function can effectuate permutation of the rows of the coding table, as described above, but after the initial encoding process using an unmodified coding table (e.g., RM coding table 400). In this example, the configuration may include a RRC signaling to let the base station 102 indicate to the UE 104 to use the interleaving function (e.g., in between RM encoding and rate matching), and/or one or more parameters for using the function, etc., to effectuate a modified encoding of the uplink communications.

In method 600, at Block 604, control information scheduling uplink communications or indicating a payload size and code length can be received from the base station. In an aspect, communicating component 242, e.g., in conjunction with processor(s) 212, memory 216, transceiver 202, etc., can receive, from the base station, the control information scheduling uplink communications or indicating the payload size and code length. For example, the control information can be received from the base station in a resource grant from the base station, which may include DCI received over a downlink control channel (e.g., PDCCH) or downlink data channel (e.g., PDSCH), etc. In addition, the resource grant or another signal from the base station can indicate a payload size and code length to use in encoding the uplink communications. In an example, the uplink communications can include UCI for transmitting to the base station. Moreover, as described, the payload size and code length can be used for determining a submatrix of the coding table (e.g., RM coding table 400 or a modified coding table) to use to encode the uplink communications.

In method 600, optionally at Block 606, it can be determined whether the configuration indicates to use a modified coding table or process. In an aspect, encoding component 252, e.g., in conjunction with processor(s) 212, memory 216, transceiver 202, communicating component 242, etc., can determine whether the configuration indicates to use the modified coding table or process. For example, encoding component 252 can determine this based on the received RRC signaling from the base station that indicates whether to use the modified coding table (e.g., as a stored modified coding table from memory 216 or as a generated modified coding table) or process (e.g., whether to perform one or more intermediate steps during the encoding).

In method 600, in one example where the configuration indicates to use the modified coding table at Block 606, optionally at Block 608, the modified coding table can be obtained. In an aspect, coding table determining component 254, e.g., in conjunction with processor(s) 212, memory 216, transceiver 202, communicating component 242, etc., can obtain the modified coding table. As described, the modified coding table can be different from the stored unmodified coding table (e.g., RM coding table 400) by having different values at least in some of the rows to prevent the long strings of zeros and ones that may cause the decoding issues described above. In this regard, the modified coding table can allow for achieving a full rank encoding.

In an example, in obtaining the modified coding table at Block 608, optionally at Block 610, the modified coding table can be obtained from memory. In an aspect, coding table determining component 254, e.g., in conjunction with processor(s) 212, memory 216, transceiver 202, communicating component 242, etc., can obtain the modified coding table from memory (e.g., memory 216). In this regard, for example, the UE 104 can be configured with the modified coding table (e.g., and the unmodified coding table, such as RM coding table 400) in memory 216 based on a wireless communication technology standard, such as 5G NR. In another example, the UE 104 can receive, in the configuration from the base station 102, the modified coding table, or one or more parameters or other information for generating the modified coding table.

In an example, in obtaining the modified coding table at Block 608, optionally at Block 612, the modified coding table can be generated. In an aspect, coding table determining component 254, e.g., in conjunction with processor(s) 212, memory 216, transceiver 202, communicating component 242, etc., can generate the modified coding table. For example, coding table determining component 254 can generate the modified coding table based on the unmodified coding table (e.g., RM coding table 400, which may be stored in memory 216) in such a way to avoid using certain values in encoding uplink communications that may result in failure decoding the uplink communications, as described. In one example, coding table determining component 254 can permute rows of the unmodified coding table (e.g., RM coding table 400) to generate the modified coding table to be used in performing the encoding of the uplink communications.

For example, coding table determining component 254 can swap two rows of the RM coding table 400 (or of a submatrix thereof), where a first row is between 1 and 11, and the second row is between 17 and 32. This can allow at least for resolving undesirable (K, N) pairs for which K<N. For example, if coding table determining component 254 swaps rows 1 and 17 in the RM coding table 400, then it can be readily checked that all submatrices obtained by taking first N rows and K columns from the modified coding matrix are of full rank (e.g., rank K) if K<N. This can imply that all (K, N) pairs with N>K may be decodable at high SNR. In an example, coding table determining component 254 can additionally or alternatively similarly swap other single row pairs of RM coding table 400 to resolve undesirable (K, N) pairs for which K<N, including rows 1 and 18, 1 and 19, 1 and 20, 1 and 27, 1 and 28, 1 and 29, 1 and 30, 2 and 19, 2 and 28, 3 and 19, 3 and 20, 3 and 30, 5 and 19, 5 and 20, 5 and 28, 5 and 29, 6 and 17, 6 and 18, 6 and 19, 6 and 29, 6 and 30, 7 and 17, 7 and 20, 7 and 28, 7 and 29.

In another example, coding table determining component 254 can swap two pairs of rows (e.g., change the ordering of four rows in total), to resolve undesirable (K, N) combinations (e.g., regardless of whether K<N). For example, if coding table determining component 254 swaps rows (2, 6) with rows (19, 24) of the RM coding table 400, then the resulting coding table can resolve all undesirable (K, N) combinations. The ordering of (19, 24) may not be specific. For example, swapping row 2 with row 19, and row 6 with row 24, or swapping row 2 with row 24, and row 6 with row 19, may yield the similar result of resolving all undesirable (K, N) combinations of RM coding table 400. In an example, coding table determining component 254 can determine which rows to permute or swap based on an indication of row index in the configuration from the base station 102. In an example, coding table determining component 254 can similarly swap two row pairs of RM coding table 400 to resolve undesirable (K, N) in this regard, including rows (2, 8) and (19, 23), (2, 8) and (19, 24), (2, 8) and (19, 27), (2, 8) and (19, 29), (2, 8) and (29, 31), (4, 6) and (25, 29), (4, 8) and (19, 23), (4, 8) and (19, 24), (4, 8) and (19, 29).

In method 600, optionally at Block 614, a submatrix of the modified table that is full rank can be generated. In an aspect, encoding component 252, e.g., in conjunction with processor(s) 212, memory 216, transceiver 202, communicating component 242, etc., can generate the submatrix of the modified coding table that is full rank. For example, encoding component 252 can select a submatrix from the modified coding table for encoding uplink communications, and the submatrix can be of full rank based on properties of the modified coding table to avoid having the same encoded values for information bits, as described above. Moreover, as described, the modified coding table can have modified values for certain rows and columns that are different from values of the unmodified coding table, where the unmodified coding table is rank deficient for some combination of rows and columns (e.g., based on having long strings of zeros or ones in a column that may result in decoding errors).

In method 600, at Block 616, the uplink communications can be encoded based on the modified coding table or a modified coding process based on the payload size and code length. In an aspect, encoding component 252, e.g., in conjunction with processor(s) 212, memory 216, transceiver 202, communicating component 242, etc., can encode the uplink communications based on the modified coding table or a modified coding process based on the payload size and code length. As described, for example, encoding component 252 can encode the uplink communications based on the modified coding table using payload size K columns and 32 rows, and then can rate match the encoding by selecting a number N rows where N<32 (or cyclically extending where N>32). Using the modified table, in this regard, the columns of the modified coding table used for encoding the uplink communications can have different values in corresponding rows to avoid decoding issues. Moreover, as described, the uplink communications being encoded may include UCI.

In another example, where the configuration indicates to use the modified coding process at Block 606, and in encoding the uplink communications based on the modified coding table or process at Block 616, optionally at Block 618, the encoded uplink communications can be interleaved before rate matching. In an aspect, encoding component 252, e.g., in conjunction with processor(s) 212, memory 216, transceiver 202, communicating component 242, etc., can interleave the encoded communications before rate matching as part of a modified coding process or as a way to effectuate a modification of the coding table after encoding. For example, as described, interleaving the encoded communications can provide effectively the same output as permutation of the row values for columns of the unmodified coding table (e.g., to effectively generate a modified coding table, as described above) prior to performing rate matching. In this example, encoding component 252 can encode the uplink communications based on the unmodified coding table (e.g., RM coding table 400) using payload size K columns and 32 rows. Encoding component 252 can then interleave encoded bits from the encoding.

For example, as described above, encoding component 252 can swap two bits in the encoded bit string (e.g., swap the first and seventeenth bits), which can provide the same result as permuting the first and seventeenth rows of the coding table before encoding, as described above. In another example, as described above, encoding component 252 can swap two pairs of bits in the encoded bit string (e.g., swap the second and nineteenth bits and swap the sixth and twenty-fourth bits, etc.), which can provide the same result as permuting the second and nineteenth rows and the sixth and twenty-fourth rows of the coding table before encoding, as described above. Encoding component 252 can then perform rate matching to select a number of bits of the encoding to represent the information for each column, where some of the bits can be interleaved as described above. In one example, parameters for performing interleaving (e.g., indices of bits in the encoded bit string to be switched, etc.) can be configured in the configuration.

In method 600, optionally at Block 620, the encoded uplink communications can be transmitted. In an aspect, encoding component 252, e.g., in conjunction with processor(s) 212, memory 216, transceiver 202, communicating component 242, etc., can transmit the encoded uplink communications, that are encoded based on the modified coding table, over the scheduled resources. This can include transmitting the encoded uplink communications over time and/or frequency resources scheduled by the base station 102, as described, such as over one or more RBs.

In method 600, where the configuration does not indicate to use the modified coding table or process at Block 606, optionally at Block 622, uplink communications can be encoded using the unmodified coding table based on the payload size and code length. In an aspect, encoding component 252, e.g., in conjunction with processor(s) 212, memory 216, transceiver 202, communicating component 242, etc., can encode the uplink communications using the unmodified coding table based on the payload size and code length. As described, for example, encoding component 252 can encode the uplink communications based on the unmodified coding table using payload size K columns and 32 rows, and then can rate match the encoding by selecting a number N rows where N<32 (or cyclically extending where N>32). In addition, optionally at Block 620, the encoded uplink communications can be transmitted. In an aspect, encoding component 252, e.g., in conjunction with processor(s) 212, memory 216, transceiver 202, communicating component 242, etc., can transmit the encoded uplink communications, that are encoded based on the unmodified coding table, over the scheduled resources.

FIG. 7 illustrates a flow chart of an example of a method 700 for configuring encoding for uplink communications based on a coding table, in accordance with aspects described herein. In an example, a base station can perform the functions described in method 700 using one or more of the components described in FIGS. 1 and 3.

In method 700, at Block 702, a configuration indicating whether to use a modified coding table or process for encoding uplink communications can be transmitted to a UE. In an aspect, configuring component 342, e.g., in conjunction with processor(s) 312, memory 316, transceiver 302, etc., can transmit, to the UE (e.g., UE 104), the configuration indicating whether to use a modified coding table or process for encoding uplink communications. In an example, as described, the UE 104 can store (e.g., in memory 216) the RM coding table 400 and a modified RM coding table that has different values for at least some of the columns that result in the undesirable pairs. For example, in the modified (e.g., new) table, at least one of the first column, fifth column, sixth column, or eleventh column can be changed with another binary sequence that avoids the long string of zeros and ones in the beginning of the column, as shown at 402, 404, 406, 408.

In one example, the configuration can indicate the coding table to be used or can be an indication to use one of multiple stored coding tables (e.g., an indicator to use the modified coding table or not, where not using the modified coding table can implicitly indicate to use the original unmodified coding table, which can be the RM coding table 400). For example, the configuration can include a new radio resource control (RRC) signaling (e.g., from base station 102 to the UE 104), to indicate to the UE 104 whether the new RM coding table or the old RM coding table should be used for encoding a UCI transmission.

In another example, the configuration can indicate whether to modify a stored coding table to generate a modified coding table. For example, the configuration can indicate whether to permute rows of the coding table, or of a submatrix generated from the coding table, to avoid the long strings of zeros or ones. In an example, the configuration may indicate whether to permute one or more rows of RM coding table 400 (e.g., such that the long strings of zeros or ones are avoided at least in columns 1, 5, 6, or 11). In this example, the configuration may include a RRC signaling to let the base station 102 indicate to the UE 104 to permute the rows of the unmodified coding table to generate the modified coding table, and/or one or more parameters for using the permuting (e.g., which rows to permute). In another example, the configuration can indicate whether to interleave values of an RM encoding (before rate matching) to effectuate the permutation. In this example, the configuration may include a RRC signaling to let the base station 102 indicate to the UE 104 to use the interleaving function (e.g., in between RM encoding and rate matching), and/or one or more parameters for using the function (e.g., which bits to interleave), etc.

In method 700, at Block 704, control information scheduling uplink communications or indicating a payload size and code length can be transmitted to the UE. In an aspect, configuring component 342, e.g., in conjunction with processor(s) 312, memory 316, transceiver 302, etc., can transmit, to the UE (e.g., UE 104), the control information scheduling uplink communications or indicating the payload size and code length. For example, the control information can be transmitted to the UE in a resource grant from the base station, which may include DCI received over a downlink control channel (e.g., PDCCH) or downlink data channel (e.g., PDSCH), etc. In addition, the resource grant or another signal from the base station can indicate a payload size and code length to use in encoding the uplink communications. In an example, the uplink communications can include UCI for transmitting to the base station. Moreover, as described, the payload size and code length can be used for determining a submatrix of the coding table (e.g., RM coding table 400 or a modified coding table) to use to encode the uplink communications.

In method 700, optionally at Block 706, encoded uplink communications can be received from the UE over resources indicated in the control information. In an aspect, configuring component 342, e.g., in conjunction with processor(s) 312, memory 316, transceiver 302, etc., can receive, from the UE, the encoded uplink communications over the resources indicated in the control information. For example, configuring component 342 can decode the uplink communications and process the communications from the UE (e.g., to obtain control information from the UE 104), which may be based on determining the coding table used by the UE 104 in encoding the uplink communications (e.g., determining whether RM coding table 400 is used, whether a permuted matrix permuted from the RM coding table 400 is used, whether interleaving is performed, etc.). In this regard, configuring component 342 can similarly determine the coding table based parameters configured or stored for indicating to the UE 104 to modify the RM coding table 400 at least for certain (K, N) pairs.

Figure 8:
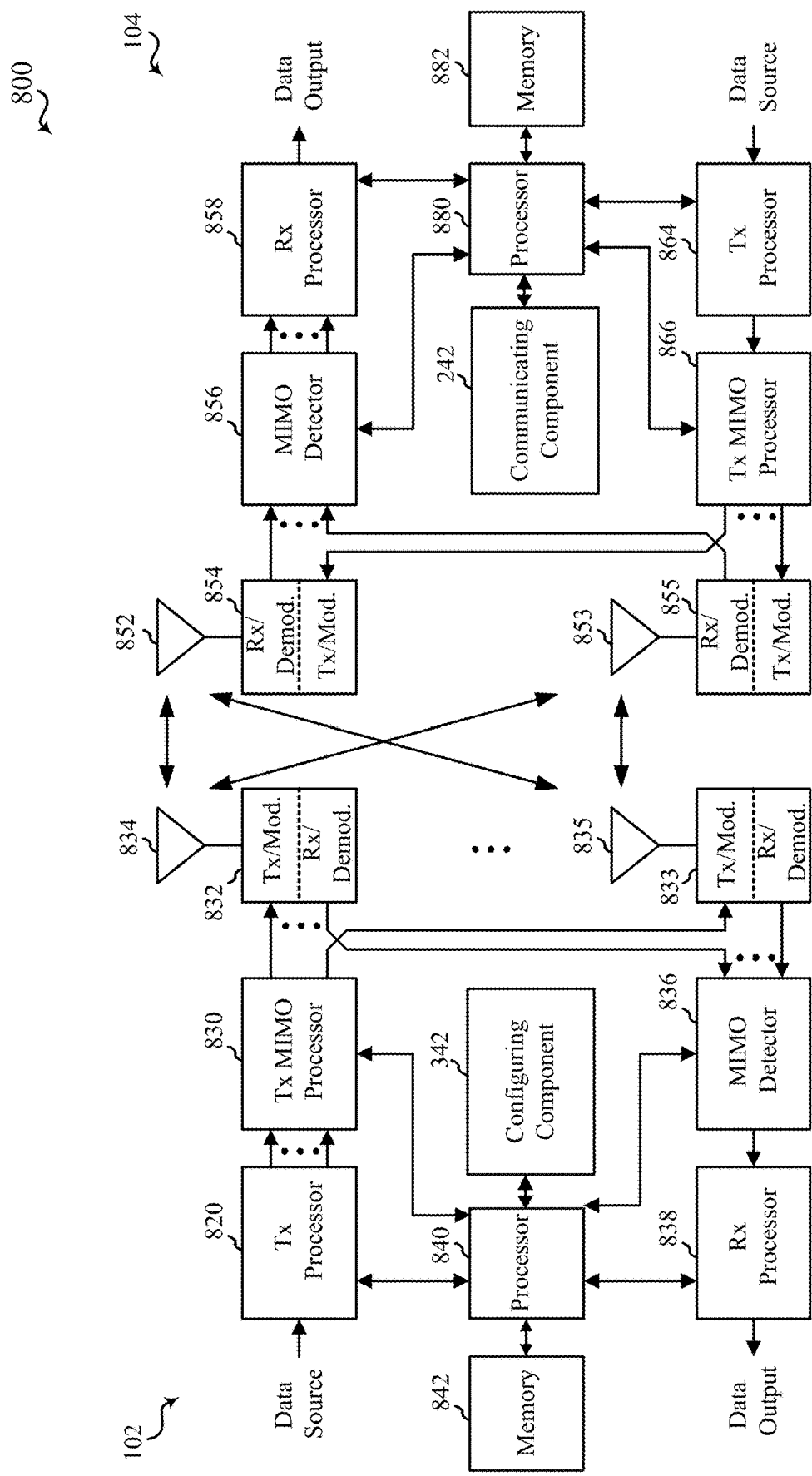
FIG. 8 is a block diagram illustrating an example of a MIMO communication system including a base station and a UE, in accordance with various aspects of the present disclosure.

FIG. 8 is a block diagram of a MIMO communication system 800 including a base station 102 and a UE 104. The MIMO communication system 800 may illustrate aspects of the wireless communication access network 100 described with reference to FIG. 1. The base station 102 may be an example of aspects of the base station 102 described with reference to FIG. 1. The base station 102 may be equipped with antennas 834 and 835, and the UE 104 may be equipped with antennas 852 and 853. In the MIMO communication system 800, the base station 102 may be able to send data over multiple communication links at the same time. Each communication link may be called a "layer" and the "rank" of the communication link may indicate the number of layers used for communication. For example, in a 2×2 MIMO communication system where base station 102 transmits two "layers," the rank of the communication link between the base station 102 and the UE 104 is two.

At the base station 102, a transmit (Tx) processor 820 may receive data from a data source. The transmit processor 820 may process the data. The transmit processor 820 may also generate control symbols or reference symbols. A transmit MIMO processor 830 may perform spatial processing (e.g., precoding) on data symbols, control symbols, or reference symbols, if applicable, and may provide output symbol streams to the transmit modulator/demodulators 832 and 833. Each modulator/demodulator 832 through 833 may process a respective output symbol stream (e.g., for OFDM, etc.) to obtain an output sample stream. Each modulator/demodulator 832 through 833 may further process (e.g., convert to analog, amplify, filter, and upconvert) the output sample stream to obtain a DL signal. In one example, DL signals from modulator/demodulators 832 and 833 may be transmitted via the antennas 834 and 835, respectively.

The UE 104 may be an example of aspects of the UEs 104 described with reference to FIGS. 1-2. At the UE 104, the UE antennas 852 and 853 may receive the DL signals from the base station 102 and may provide the received signals to the modulator/demodulators 854 and 855, respectively. Each modulator/demodulator 854 through 855 may condition (e.g., filter, amplify, downconvert, and digitize) a respective received signal to obtain input samples. Each modulator/demodulator 854 through 855 may further process the input samples (e.g., for OFDM, etc.) to obtain received symbols. A MIMO detector 856 may obtain received symbols from the modulator/demodulators 854 and 855, perform MIMO detection on the received symbols, if applicable, and provide detected symbols. A receive (Rx) processor 858 may process (e.g., demodulate, deinterleave, and decode) the detected symbols, providing decoded data for the UE 104 to a data output, and provide decoded control information to a processor 880, or memory 882.

The processor 880 may in some cases execute stored instructions to instantiate a communicating component 242 (see e.g., FIGS. 1 and 2).

On the uplink (UL), at the UE 104, a transmit processor 864 may receive and process data from a data source. The transmit processor 864 may also generate reference symbols for a reference signal. The symbols from the transmit processor 864 may be precoded by a transmit MIMO processor 866 if applicable, further processed by the modulator/demodulators 854 and 855 (e.g., for SC-FDMA, etc.), and be transmitted to the base station 102 in accordance with the communication parameters received from the base station 102. At the base station 102, the UL signals from the UE 104 may be received by the antennas 834 and 835, processed by the modulator/demodulators 832 and 833, detected by a MIMO detector 836 if applicable, and further processed by a receive processor 838. The receive processor 838 may provide decoded data to a data output and to the processor 840 or memory 842.

The processor 840 may in some cases execute stored instructions to instantiate a configuring component 342 (see e.g., FIGS. 1 and 3).

The components of the UE 104 may, individually or collectively, be implemented with one or more ASICs adapted to perform some or all of the applicable functions in hardware. Each of the noted modules may be a means for performing one or more functions related to operation of the MIMO communication system 800. Similarly, the components of the base station 102 may, individually or collectively, be implemented with one or more application specific integrated circuits (ASICs) adapted to perform some or all of the applicable functions in hardware. Each of the noted components may be a means for performing one or more functions related to operation of the MIMO communication system 800.

The following aspects are illustrative only and aspects thereof may be combined with aspects of other embodiments or teaching described herein, without limitation.

Aspect 1 is a method for wireless communication including receiving, from a base station, control information scheduling uplink communications, wherein the control information indicates a payload size and a code length for encoding the uplink communications based on a code, determining whether a pair of the payload size and the code length is in a list of undesirable pairs for performing the encoding, and determining an error case where it is determined that the pair is in the list of undesirable pairs.

In Aspect 2, the method of Aspect 1 includes where the uplink communications are UCI, where the scheduled resources correspond to an uplink control channel.

In Aspect 3, the method of any of Aspects 1 or 2 includes refraining from selecting the pair for encoding the uplink communications where it is determined that the pair is in the list of undesirable pairs.

In Aspect 4, the method of any of Aspects 1 to 3 includes refraining from transmitting the uplink communications over scheduled resources where it is determined that the pair is in the list of undesirable pairs.

In Aspect 5, the method of Aspect 4 includes where the uplink communications are UCI, where the scheduled resources correspond to an uplink data channel, and further comprising transmitting uplink data channel communications over the uplink data channel.

Aspect 6 is a method for wireless communication including receiving, from a base station, a configuration indicating whether to use a modified coding table for encoding uplink communications, receiving, from the base station, control information scheduling the uplink communications, where the control information indicates a payload size and a code length for encoding the uplink communications, encoding the uplink communications using the modified coding table based on the payload size and the code length where the configuration indicates to use the modified coding table, and encoding the uplink communications using an unmodified coding table based on the payload size and the code length where the configuration indicates to use the unmodified coding table.

In Aspect 7, the method of Aspect 6 includes where encoding the uplink communications using the modified coding table includes generating a submatrix of a first number of columns and a second number of rows from the modified coding table, where the submatrix is of full rank, and where the first number of columns corresponds to the payload size and the second number of rows corresponds to the code length, and encoding the uplink communications based on the submatrix.

In Aspect 8, the method of any of Aspects 6 or 7 includes where at least one submatrix of a first number of columns and a second number of rows from the unmodified coding table is rank deficient.

In Aspect 9, the method of any of Aspects 6 to 8 includes obtaining the modified coding table from a memory where the configuration indicates to use the modified coding table.

In Aspect 10, the method of any of Aspects 6 to 9 includes where the modified coding table includes at least one column related to a payload size that has same values for all code lengths as at least one column related to the payload size in the unmodified coding table.

In Aspect 11, the method of Aspect 10 includes where the modified coding table includes at least one second column related to a second payload size that has different values for at least one of the code lengths as at least one second column related to the second payload size in the unmodified coding table.

In Aspect 12, the method of any of Aspects 6 to 11 includes where encoding the uplink communications using the modified coding table includes permuting rows of the unmodified coding table to generate the modified coding table.

In Aspect 13, the method of Aspect 12 includes where the configuration indicates one or more parameters for permuting rows of the unmodified coding table to generate the modified coding table, where permuting rows of the unmodified coding table to generate the modified coding table is based at least in part on the one or more parameters.

Aspect 14 is a method for wireless communication including receiving, from a base station, a configuration indicating whether to use a modified coding process for encoding uplink communications, receiving, from the base station, control information scheduling the uplink communications, where the control information indicates a payload size and a code length for encoding the uplink communications, encoding the uplink communications using an unmodified coding table based on the payload size and the code length to generate an encoded bit string, and interleaving one or more bits of the encoded bit string where the configuration indicates to use the modified coding process.

In Aspect 15, the method of Aspect 14 includes where the configuration indicates the one or more bits to interleave.

In Aspect 16, the method of any of Aspects 14 or 15 includes performing rate matching of the encoded bit string, as interleaved, to generate a rate matched bit string as the encoded uplink communications for transmission.

Aspect 17 is a method for wireless communication that includes transmitting, to a UE, a configuration indicating whether to use a modified coding table for encoding uplink communications, and transmitting, to the UE, control information scheduling uplink communications, where the control information indicates a payload size and a code length for encoding the uplink communications.

In Aspect 18, the method of Aspect 17 includes where the configuration includes one or more parameters for permuting rows of an unmodified coding table to generate the modified coding table.

Aspect 19 is a method for wireless communication including receiving, from a base station, control information scheduling uplink communications, where the control information indicates a payload size and a code length for encoding the uplink communications based on a code, and triggering an error case where a pair of the payload size and the code length is considered undesirable for performing the encoding.

In Aspect 20, the method of Aspect 19 includes where the uplink communications include UCI, where the scheduling corresponds to an uplink control channel.

In Aspect 21, the method of any of Aspects 19 or 20 includes where triggering the error case includes refraining from selecting the pair for encoding the uplink communications where it is determined that the pair is undesirable for performing the encoding.

In Aspect 22, the method of any of Aspects 19 to 21 includes where triggering the error case includes refraining from transmitting the uplink communications over scheduled resources where it is determined that the pair is undesirable for performing the encoding.

In Aspect 23, the method of Aspect 22 includes where the uplink communications include UCI, where the scheduled resources correspond to an uplink data channel, and including transmitting uplink data channel communications over the uplink data channel.

In Aspect 24, the method of any of Aspects 19 to 23 includes where triggering the error case is based at least in part on detecting the pair in a list of undesirable pairs configured for performing the encoding.

In Aspect 25, the method of Aspect 24 includes where the undesirable pairs in the list correspond to code configurations that include identical column vectors in a coding table.

In Aspect 26, the method of any of Aspects 24 or 25 includes where the list of undesirable pairs includes the following pairs of values of undesirable payload size and undesirable code length: (4,4), (5,5), (6,6), (6,7), (6,8), (6,9), (6,10), (7,7), (7,8), (7,9), (7,10), (8,8), (8,9), (8,10), (9,9), (9,10), (10,10), (11,11), (11,12), (11,13), (11,14), (11,15), (11,16).

In Aspect 27, the method of any of Aspects 19 to 26 includes receiving a configured table of payload sizes and code lengths, where the pair of the payload size and the code length is indicated in the configured table.

Aspect 28 is a method for wireless communication including receiving, from a base station, a configuration indicating whether to use a modified coding table for encoding uplink communications, receiving, from the base station, control information scheduling the uplink communications, where the control information indicates a payload size and a code length for encoding the uplink communications, encoding the uplink communications based on the modified coding table based on the payload size and the code length where the configuration indicates to use the modified coding table, encoding the uplink communications using an unmodified coding table based on the payload size and the code length where the configuration indicates to use the unmodified coding table, and transmitting the encoded uplink communications.

In Aspect 29, the method of Aspect 28 includes where encoding the uplink communications based on the modified coding table includes generating a submatrix of a first number of columns and a second number of rows from the modified coding table, where the submatrix is of full rank, and where the first number of columns corresponds to the payload size and the second number of rows corresponds to the code length, and encoding the uplink communications based on the submatrix.

In Aspect 30, the method of any of Aspects 28 or 29 includes where at least one submatrix of a first number of columns and a second number of rows from the unmodified coding table is rank deficient.

In Aspect 31, the method of any of Aspects 28 to 30 includes obtaining the modified coding table from a memory where the configuration indicates to use the modified coding table.

In Aspect 32, the method of any of Aspects 28 to 31 includes where the modified coding table includes at least one column related to a payload size that has same values for all code lengths as at least one column related to the payload size in the unmodified coding table.

In Aspect 33, the method of Aspect 32 includes where the modified coding table includes at least one second column related to a second payload size that has different values for at least one of the code lengths as at least one second column related to the second payload size in the unmodified coding table.

In Aspect 34, the method of any of Aspects 28 to 33 includes where encoding the uplink communications based on the modified coding table includes permuting rows of the unmodified coding table to generate the modified coding table.

In Aspect 35, the method of Aspect 34 includes where the configuration indicates one or more parameters for permuting rows of the unmodified coding table to generate the modified coding table, where permuting rows of the unmodified coding table to generate the modified coding table is based at least in part on the one or more parameters.

In Aspect 36, the method of any of Aspects 28 to 35 includes where encoding the uplink communications based on the modified coding table includes encoding the uplink communications using the unmodified coding table based on the payload size and the code length to generate an encoded bit string, and interleaving one or more bits of the encoded bit string.

In Aspect 37, the method of Aspect 36 includes where the configuration indicates the one or more bits to interleave.

In Aspect 38, the method of any of Aspects 36 or 37 includes performing rate matching of the encoded bit string, as interleaved, to generate a rate matched bit string as the encoded uplink communications for transmission.

Aspect 39 is an apparatus for wireless communication including a transceiver, a memory configured to store instructions, and one or more processors communicatively coupled with the memory and the transceiver, where the one or more processors are configured to perform one or more of the methods of any of Aspects 1 to 38.

Aspect 40 is an apparatus for wireless communication including means for performing one or more of the methods of any of Aspects 1 to 38.

Aspect 41 is a computer-readable medium including code executable by one or more processors for wireless communications, the code including code for performing one or more of the methods of any of Aspects 1 to 38.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially programmed device, such as but not limited to a processor, a digital signal processor (DSP), an ASIC, a field programmable gate array (FPGA) or other programmable logic device, a discrete gate or transistor logic, a discrete hardware component, or any combination thereof designed to perform the functions described herein. A specially programmed processor may be a microprocessor, but in the alternative, the processor may be any conventional processor, controller, microcontroller, or state machine. A specially programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Thus, the disclosure is not to be limited to the examples and designs described herein but is to be accorded the widest scope consistent with the principles and novel features disclosed herein.

What is claimed is:

1. An apparatus for wireless communication, comprising:
 a transceiver;
 a memory configured to store instructions; and
 one or more processors communicatively coupled with the memory and the transceiver, wherein the one or more processors are configured to:
  receive, from a base station, control information scheduling uplink communications, wherein the control information indicates a payload size and a code length for encoding the uplink communications based on a code; and
  trigger an error case where a pair of the payload size and the code length is considered undesirable for performing the encoding,
  wherein triggering the error case includes refraining from transmitting the uplink communications over scheduled resources.

2. The apparatus of claim 1, wherein the uplink communications include uplink control information (UCI), wherein the scheduling corresponds to an uplink control channel.

3. The apparatus of claim 1, wherein the uplink communications include uplink control information (UCI), wherein the scheduled resources correspond to an uplink data channel, and wherein the one or more processors are further configured to transmit uplink data channel communications over the uplink data channel.

4. The apparatus of claim 1, wherein the one or more processors are configured to trigger the error case based at least in part on detecting the pair in a list of undesirable pairs configured for performing the encoding.

5. The apparatus of claim 4, wherein the undesirable pairs in the list correspond to code configurations that include identical column vectors in a coding table.

6. The apparatus of claim 4, wherein the list of undesirable pairs includes the following pairs of values of undesirable payload size and undesirable code length: (4,4), (5,5), (6,6), (6,7), (6,8), (6,9), (6,10), (7,7), (7,8), (7,9), (7,10), (8,8), (8,9), (8,10), (9,9), (9,10), (10,10), (11,11), (11,12), (11,13), (11,14), (11,15), (11,16).

7. The apparatus of claim 1, wherein the one or more processors are further configured to receive a configured table of payload sizes and code lengths, wherein the pair of the payload size and the code length is indicated in the configured table.

8. An apparatus for wireless communication, comprising:
   a transceiver;
   a memory configured to store instructions; and
   one or more processors communicatively coupled with the memory and the transceiver, wherein the one or more processors are configured to:
   receive, from a base station, a configuration indicating whether to use a modified coding table, instead of an unmodified coding table configured at the apparatus, from which to select a submatrix for encoding uplink communications;
   receive, from the base station, control information scheduling the uplink communications, wherein the control information indicates a payload size and a code length for encoding the uplink communications;
   encode the uplink communications using the submatrix that is based on the modified coding table based on the payload size and the code length where the configuration indicates to use the modified coding table;
   encode the uplink communications using the submatrix of the unmodified coding table based on the payload size and the code length where the configuration indicates to use the unmodified coding table; and
   transmit the encoded uplink communications.

9. The apparatus of claim 8, wherein the one or more processors are configured to generate the submatrix of a first number of columns and a second number of rows from the modified coding table, wherein the submatrix is of full rank, and wherein the first number of columns corresponds to the payload size and the second number of rows corresponds to the code length.

10. The apparatus of claim 8, wherein at least one submatrix of a first number of columns and a second number of rows from the unmodified coding table is rank deficient.

11. The apparatus of claim 8, wherein the one or more processors are further configured to obtain the modified coding table from a memory where the configuration indicates to use the modified coding table.

12. The apparatus of claim 8, wherein the modified coding table includes at least one column related to a payload size that has same values for all code lengths as at least one column related to the payload size in the unmodified coding table.

13. The apparatus of claim 12, wherein the modified coding table includes at least one second column related to a second payload size that has different values for at least one of the code lengths as at least one second column related to the second payload size in the unmodified coding table.

14. The apparatus of claim 8, wherein the one or more processors are configured to generate the modified coding table at least in part by permuting rows of the unmodified coding table.

15. The apparatus of claim 14, wherein the configuration indicates one or more parameters for permuting rows of the unmodified coding table to generate the modified coding table, wherein the one or more processors are configured to permute rows of the unmodified coding table to generate the modified coding table based at least in part on the one or more parameters.

16. The apparatus of claim 8, wherein the one or more processors are configured to encode the uplink communications using the submatrix that is based on the modified coding table including:
   encoding the uplink communications using the submatrix of the unmodified coding table based on the payload size and the code length to generate an encoded bit string; and
   interleaving one or more bits of the encoded bit string.

17. The apparatus of claim 16, wherein the configuration indicates the one or more bits to interleave.

18. The apparatus of claim 16, wherein the one or more processors are further configured to perform rate matching of the encoded bit string, as interleaved, to generate a rate matched bit string as the encoded uplink communications for transmission.

19. A method for wireless communication, comprising:
   receiving, from a base station, control information scheduling uplink communications, wherein the control information indicates a payload size and a code length for encoding the uplink communications based on a code; and
   triggering an error case where a pair of the payload size and the code length is considered undesirable for performing the encoding,
   wherein triggering the error case includes refraining from transmitting the uplink communications over scheduled resources.

20. The method of claim 19, wherein the uplink communications include uplink control information (UCI), wherein the scheduling corresponds to an uplink control channel.

21. The method of claim 19, wherein the uplink communications include uplink control information (UCI), wherein the scheduled resources correspond to an uplink data channel, and further comprising transmitting uplink data channel communications over the uplink data channel.

22. The method of claim 19, wherein triggering the error case is based at least in part on detecting the pair in a list of undesirable pairs configured for performing the encoding.

23. The method of claim 22, wherein the undesirable pairs in the list correspond to code configurations that include identical column vectors in a coding table.

24. The method of claim 19, further comprising receiving a configured table of payload sizes and code lengths, wherein the pair of the payload size and the code length is indicated in the configured table.

25. A method for wireless communication at a user equipment (UE), comprising:
   receiving, from a base station, a configuration indicating whether to use a modified coding table, instead of an unmodified coding table configured at the UE, from which to select a submatrix for encoding uplink communications;
   receiving, from the base station, control information scheduling the uplink communications, wherein the control information indicates a payload size and a code length for encoding the uplink communications;
   encoding the uplink communications using the submatrix that is based on the modified coding table based on the payload size and the code length where the configuration indicates to use the modified coding table;
   encoding the uplink communications using the submatrix of the unmodified coding table based on the payload size and the code length where the configuration indicates to use the unmodified coding table; and transmitting the encoded uplink communications.

26. The method of claim 25, further comprising:

generating the submatrix of a first number of columns and a second number of rows from the modified coding table, wherein the submatrix is of full rank, and wherein the first number of columns corresponds to the payload size and the second number of rows corresponds to the code length.

27. The method of claim 25, wherein at least one submatrix of a first number of columns and a second number of rows from the unmodified coding table is rank deficient.

28. The method of claim 25, further comprising obtaining the modified coding table from a memory where the configuration indicates to use the modified coding table.

29. The method of claim 25, wherein the modified coding table includes at least one column related to a payload size that has same values for all code lengths as at least one column related to the payload size in the unmodified coding table.

30. The method of claim 29, wherein the modified coding table includes at least one second column related to a second payload size that has different values for at least one of the code lengths as at least one second column related to the second payload size in the unmodified coding table.

* * * * *